(12) United States Patent
Liu et al.

(10) Patent No.: US 11,736,026 B2
(45) Date of Patent: Aug. 22, 2023

(54) FLYBACK CONVERTER WITH FAST LOAD TRANSIENT DETECTION

(71) Applicant: DIALOG SEMICONDUCTOR INC., Campbell, CA (US)

(72) Inventors: Mengfei Liu, Campbell, CA (US); Yimin Chen, Campbell, CA (US); David Nguyen, Campbell, CA (US); Juyoung Yoon, Campbell, CA (US); Tao Li, Campbell, CA (US); Guang Feng, Campbell, CA (US); Kai-Wen Chin, Campbell, CA (US); Yong Xiong Lin, Campbell, CA (US); Jianming Yao, Campbell, CA (US)

(73) Assignee: Dialog Semiconductor Inc., Campbell, CA (US)

( * ) Notice: Subject to any disclaimer, the term of this patent is extended or adjusted under 35 U.S.C. 154(b) by 421 days.

(21) Appl. No.: 16/888,437

(22) Filed: May 29, 2020

(65) Prior Publication Data
US 2021/0376742 A1    Dec. 2, 2021

(51) Int. Cl.
*H02M 3/335* (2006.01)
*H03F 3/45* (2006.01)
(Continued)

(52) U.S. Cl.
CPC .. *H02M 3/33576* (2013.01); *G01R 19/16528* (2013.01); *H03F 3/45* (2013.01);
(Continued)

(58) Field of Classification Search
CPC ............ H02M 3/22; H02M 1/08; H02M 1/36; H02M 3/24; H02M 3/325; H02M 3/335; H02M 3/28; H02M 3/33569; H02M 3/33507; H02M 2007/4815; H02M 2007/4818; H02M 1/083; H02M 3/33538; H02M 3/33546; H02M 3/33515; H02M 3/33576; H02M 3/33592; H02M 3/33553; H02M 3/33523; H02M 5/2573; H02M 1/081; H02M 5/293; H02M 7/12; H02M 3/10; H02M 3/125; H02M 3/13; H02M 3/135; H02M 3/145; H02M 3/15; H02M 3/155; H02M 3/156; H02M 3/158; H02M 3/1588; H02M 2003/1566; H02M 3/1582; H02M 2003/1557; H02M 1/12; H02M 3/3155; H02M 7/1557; H02M 7/1626;
(Continued)

(56) References Cited

U.S. PATENT DOCUMENTS

| 4,866,367 A | * | 9/1989 | Ridley | ................ H02M 3/1563 363/21.04 |
| 8,804,379 B2 | * | 8/2014 | Hsu | ................... H02M 3/33507 363/21.16 |

(Continued)

FOREIGN PATENT DOCUMENTS

| ES | 2703862 | * | 3/2019 |
| JP | 2015-167443 | * | 9/2015 |
| KR | 1020150111068 | * | 10/2015 |

*Primary Examiner* — Thienvu V Tran
*Assistant Examiner* — Nusrat Quddus
(74) *Attorney, Agent, or Firm* — Haynes and Boone, LLP (57) ABSTRACT

A flyback converter is provided that detects a load-transient-produced increase in the output current to more quickly detect and respond to the load transient.

18 Claims, 8 Drawing Sheets

(51) Int. Cl.
*G01R 19/165* (2006.01)
*H03K 5/24* (2006.01)
*H04B 10/80* (2013.01)
*H03K 17/78* (2006.01)
*H03M 1/00* (2006.01)
*H02M 1/00* (2006.01)

(52) U.S. Cl.
CPC .............. *H03K 5/24* (2013.01); *H03K 17/78* (2013.01); *H03M 1/001* (2013.01); *H04B 10/802* (2013.01); *H02M 1/0009* (2021.05); *H02M 1/0025* (2021.05); *H03F 2203/45601* (2013.01)

(58) Field of Classification Search
CPC .......... H02M 1/4208; H02M 7/53871; H02M 7/219; H02M 7/151; H02M 1/4233; H02M 5/4585; H02M 7/217; H02M 7/1552; H02M 7/1623; H02M 1/4225; H02M 3/073; H02M 3/137; H02M 7/10; H02M 7/00; H02M 7/06; H02M 7/064; H02M 7/068; H02M 1/32; H02M 2001/322; H02M 2001/327; H02M 1/34; H02M 2001/342; H02M 2001/344; H02M 2001/346; H02M 2001/348; H02M 1/38; H02M 1/42; H02M 1/4216; H02M 1/4241; H02M 1/425; H02M 1/4258; H02M 1/4266; H02M 2001/4275; H02M 2001/4283; H02M 2001/4291; Y02B 70/1491; G05F 1/00; G05F 1/10; G05F 1/12; G05F 1/46; G05F 1/455; G05F 1/45; G05F 1/445; G05F 1/66; G05F 1/40; G05F 1/42; G05F 1/44; G05F 1/462; G05F 1/52; G05F 1/56; G05F 3/10; G05F 3/16; G05F 3/18; G05F 3/185; G05F 3/20; G05F 3/26; G05F 3/30; G05F 3/205; G05F 3/22; G05F 3/24; G05F 3/222; G05F 3/242; G05F 3/225; G05F 3/227; G05F 3/245; G05F 3/247; G05F 3/262; G05F 3/265; G05F 3/267; G05F 1/575; G05F 1/30; G05F 1/33; G05F 1/32; G05F 1/34; G05F 1/38; H05B 39/048; B23K 11/24; H04B 2215/069; H02J 7/12

See application file for complete search history.

(56) References Cited

U.S. PATENT DOCUMENTS

| | | | |
|---|---|---|---|
| 9,101,015 B2* | 8/2015 | Yan ..................... | H05B 41/2928 |
| 9,966,832 B1* | 5/2018 | Engelhardt ............ | H03K 5/135 |
| 9,979,309 B1* | 5/2018 | Green ..................... | H02M 1/08 |
| 10,008,944 B2* | 6/2018 | Li .......................... | H02M 1/08 |
| 10,175,278 B1* | 1/2019 | Paduvalli ............... | G01R 27/26 |
| 10,666,150 B1* | 5/2020 | Chin .................... | H02M 3/3353 |
| 10,811,978 B1* | 10/2020 | Zheng ............... | H02M 3/33592 |
| 10,958,177 B2* | 3/2021 | Li ..................... | H02M 3/33515 |
| 2010/0148730 A1* | 6/2010 | Choi .................. | H02J 7/007182 |
| | | | 320/145 |
| 2010/0208500 A1* | 8/2010 | Yan .................... | H02M 3/33523 |
| | | | 363/21.12 |
| 2011/0122664 A1* | 5/2011 | Yabuzaki ................ | H02M 1/32 |
| | | | 363/53 |
| 2011/0242858 A1* | 10/2011 | Strzalkowski .... | H02M 3/33515 |
| | | | 363/21.13 |
| 2012/0126789 A1* | 5/2012 | Turpin ................. | G01R 15/181 |
| | | | 324/117 R |
| 2013/0242625 A1* | 9/2013 | Yan ........................ | H05B 45/14 |
| | | | 363/49 |
| 2013/0272035 A1* | 10/2013 | Strzalkowski .... | H02M 3/33546 |
| | | | 363/21.01 |
| 2014/0019743 A1* | 1/2014 | DeLuca ................ | G06F 1/3206 |
| | | | 713/100 |
| 2014/0092646 A1* | 4/2014 | Cleveland ......... | H02M 3/33592 |
| | | | 363/21.14 |
| 2014/0176107 A1* | 6/2014 | Yu ......................... | H02M 3/156 |
| | | | 323/285 |
| 2014/0268911 A1* | 9/2014 | Telefus ............. | H02M 3/33523 |
| | | | 363/21.08 |
| 2015/0062978 A1* | 3/2015 | Lee ...................... | H02M 1/4258 |
| | | | 363/21.16 |
| 2016/0079851 A1* | 3/2016 | Babazadeh ........... | H02M 3/157 |
| | | | 323/271 |
| 2016/0141966 A1* | 5/2016 | Huang .............. | H02M 3/33523 |
| | | | 363/21.15 |
| 2016/0190941 A1* | 6/2016 | Kuang ................ | H05B 45/3725 |
| | | | 363/21.01 |
| 2017/0005582 A1* | 1/2017 | Takegami ......... | H02M 3/33546 |
| 2017/0085184 A1* | 3/2017 | Lai .................... | H02M 3/33507 |
| 2017/0201184 A1* | 7/2017 | Yonezawa ............... | H02M 1/32 |
| 2017/0366092 A1* | 12/2017 | Langeslag ......... | H02M 3/33523 |
| 2018/0131270 A1* | 5/2018 | Morel .................... | H02M 1/32 |
| 2018/0351462 A1* | 12/2018 | Li .............................. | H02J 7/02 |
| 2018/0367045 A1* | 12/2018 | Zhang .................... | H02M 1/08 |
| 2020/0112264 A1* | 4/2020 | Arima .................... | H02M 1/32 |
| 2020/0382006 A1* | 12/2020 | Li ..................... | H02M 3/33515 |
| 2021/0296994 A1* | 9/2021 | Kim ...................... | H05B 45/14 |
| 2022/0263412 A1* | 8/2022 | Bertolini ................ | H02M 1/08 |

* cited by examiner

FLYBACK CONVERTER WITH FAST LOAD TRANSIENT DETECTION

TECHNICAL FIELD

This application relates to switching power converters, and more particularly to flyback converters with fast load transient detection and response.

BACKGROUND

To regulate an output voltage, a flyback converter includes a feedback loop that generates an error signal based upon a difference (the error) between the output voltage and a desired output voltage. The feedback loop includes a compensation circuit that applies a gain to the error signal to generate a control signal. With regard to the control signal generation, note that it may occur on the primary side or on the secondary side of the flyback converter's transformer. Should the feedback loop generate the control signal on the secondary side, the resulting regulation of the output voltage is known as secondary-side regulation (SSR). Conversely, if the feedback loop generates the control signal on the primary side, the output voltage regulation is denoted as primary-only regulation or primary-side regulation (PSR).

The output voltage is isolated from the primary side of the flyback converter through the transformer. To sense the output voltage in a PSR flyback converter, a primary-side controller typically senses an auxiliary winding voltage at the transformer reset time. The transformer reset time extends from the switching off of the primary-side power switch to when the secondary winding current has ramped down to zero. But this indirect sensing of the output voltage through the reflected voltage on the auxiliary winding requires the primary-side power switch transistor to have been cycled. It is thus conventional in a PSR flyback converter for a secondary-side controller to trigger an under-voltage alarm if the output voltage is less than a threshold voltage. The secondary-side controller then transmits the under-voltage alarm through an isolating channel (e.g., an optocoupler) to the primary-side controller to trigger the primary-side controller to cycle the power switch transistor. This cycling of the power switch transistor then enables the primary-side controller to sense the reflected voltage on the auxiliary winding to indirectly sense the output voltage. But note that this indirect sensing of the output voltage is subject to some inaccuracies. In contrast, a secondary-side controller in an SSR flyback converter may directly sense the output voltage. The resulting error signal generation in an SSR flyback converter is thus typically more accurate than a corresponding error signal generation in a PSR flyback converter. After compensation of the error signal to form the control signal, the secondary-side controller in an SSR flyback converter transmits the control signal to the primary-side controller through an isolating channel such as an optoisolator. The primary-side controller then adjusts the cycling of the power switch transistor such as by changing the pulse width modulation or the frequency pulse modulation to regulate the output voltage. In another variant of an SSR flyback converter, the secondary-side controller itself processes the control signal to determine the power switch modulation. In such an SSR variant, the secondary-side controller transmits a power switch cycling command (such as a switch on command and/or a switch off command) through the optoisolator to the primary side.

Although SSR flyback converters can offer improved output voltage regulation, their use typically suffers from excessive latency in responding to load transients. For example, during a light or no load condition, the power switch cycling is reduced to a very slow rate. Since the power switch is effectively no longer cycling, the output voltage is supported by an output capacitor. But this output capacitor is quickly discharged upon the sudden application of a load such that the output voltage begins to fall out of regulation. To sense the load application in an SSR flyback, it is conventional for a secondary-side controller to include an analog-to-digital converter (ADC) that digitizes the output voltage into a digital voltage that is then processed to form the error signal and ultimately the control signal voltage. Depending upon the SSR implementation, the control signal voltage or a power switch cycling command is then transmitted through the optocoupler to the primary side, whereupon the power switch cycling is accelerated to bring the output voltage back into regulation. But the digitization through the ADC typically requires a sample-and-hold delay and an ADC comparator delay. The digitization delay may be denoted as a Vout-based detection delay. This detection delay will now be discussed along with some other example waveforms.

Figure 1:
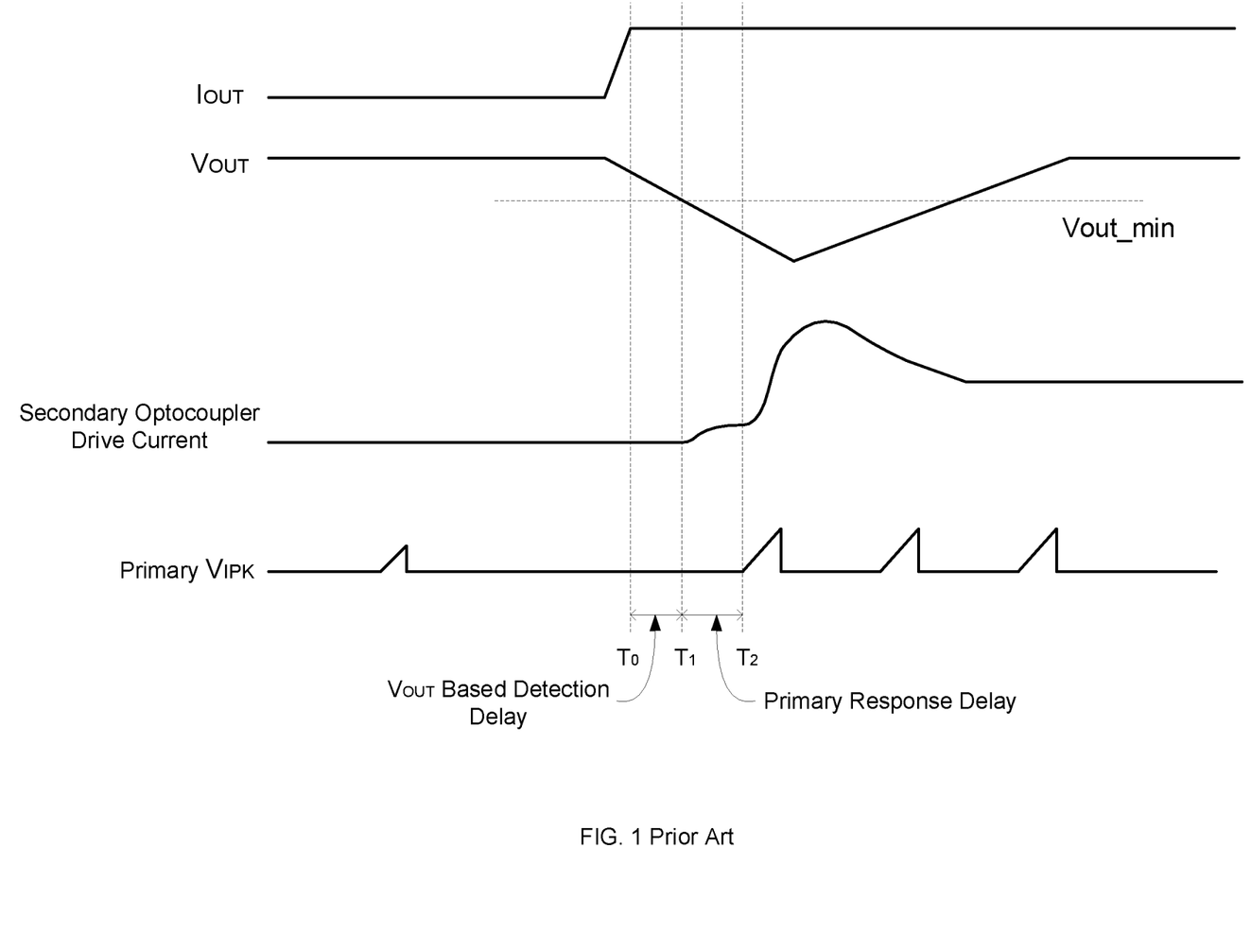
FIG. 1 illustrates some operating waveforms of a conventional flyback converter that detects a load transient through a digitization of the output voltage by an analog-to-digital converter.

Some example waveforms for a conventional SSR flyback converter are shown in FIG. 1. The cycling of the power switch is represented by a primary sense resistor voltage (Vipk) that occurs across a primary-side sense resistor in series with the power switch transistor. Prior to a time T0, the SSR flyback converter was in a low-load state so the pulsing of the primary sense resistor voltage occurs at a relatively slow rate. The output voltage Vout is thus supported by the output capacitor prior to time T0. At time T0, a sudden application of a load (e.g, the consumer plugs in their mobile device to the charger including the SSR flyback converter) causes the output current Iout to suddenly increase. Since the output voltage Vout is only being passively supported by the output capacitor, the output voltage Vout begins to decline at time T0. Due to the Vout-based detection delay, it is not until a time T1 that the secondary-side controller transmits to the optocoupler. This transmission may be of the control signal voltage or a power switch cycling command depending upon the embodiment. The secondary-side optocoupler drive current thus begins to increase at time T1. From time T1, a primary response delay occurs that ends at a time T2 when the power switch transistor is cycled, causing the voltage Vipk to begin ramping up. In turn, the secondary-side optocoupler drive current also continues to increase. The subsequent cycling of the power switch transistor causes the output voltage to rise back into regulation. But note that there is a voltage margin that establishes an acceptable minimum output voltage (Vout_min). The delay from time T0 to time T2 may be such that the output voltage falls below this acceptable minimum output voltage. An analogous processing delay occurs in PSR flyback converters.

Accordingly, there is a need in the art for flyback converters with faster load transient detection and response.

SUMMARY

In accordance with a first aspect of the disclosure, a secondary-side controller for a flyback converter is provided that includes: a secondary-side sense resistor for producing a secondary-side sense resistor voltage in response to an output current; a compensation circuit for multiplying an error signal by a gain to produce a control signal; and an output current detection circuit configured to command the compensation circuit to increase the gain responsive to a detection of the secondary-side sense resistor voltage being greater than a threshold value.

In accordance with a second aspect of the disclosure, a secondary-side controller for a flyback converter is provided that includes: a secondary-side sense resistor for producing a secondary-side sense resistor voltage in response to an output current of the flyback converter; an output current detection circuit configured to assert an output signal responsive to a detection of the secondary-side sense resistor voltage being greater than a threshold value; an under-voltage threshold control circuit configured to increase a threshold voltage from a default value to an increased value responsive to the assertion of the output signal; and an under-voltage comparator configured to assert an under-voltage output signal responsive to an output voltage of the flyback converter being greater than the threshold voltage.

In accordance with a third aspect of the disclosure, a method of detecting an application of a load for a flyback converter is provided that includes: processing a secondary-side sense resistor voltage to detect the application of the load; and triggering a cycling of a power switch transistor in response to the detection of the application of the load.

These and other aspects of the invention will become more fully understood upon a review of the detailed description, which follows. Other aspects, features, and embodiments will become apparent to those of ordinary skill in the art, upon reviewing the following description of specific, exemplary embodiments in conjunction with the accompanying figures. While features may be discussed relative to certain embodiments and figures below, all embodiments can include one or more of the advantageous features discussed herein. In other words, while one or more embodiments may be discussed as having certain advantageous features, one or more of such features may also be used in accordance with the various embodiments discussed herein. In similar fashion, while exemplary embodiments may be discussed below as device, system, or method embodiments it should be understood that such exemplary embodiments can be implemented in various devices, systems, and methods.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Flyback converters are provided in which the output current is used to detect a load transient. The resulting detection of the load transient is advantageously faster as compared to a conventional output-voltage-based (Vout-based) detection because the output current change is phased 90 degrees in advance of the output voltage change. In addition, the response time is also improved. These load transient detection and response improvements are provided for flyback converters with both SSR and PSR.

As discussed earlier, it is conventional for a flyback converter feedback loop to generate an error signal based upon a difference (the error) between the output voltage and a desired output voltage. The feedback loop includes a compensation circuit that applies a gain to the error signal to generate the control signal voltage. In an SSR flyback converter, the control signal voltage generation occurs on the secondary-side of the transformer. Conversely, the control signal voltage generation occurs on the primary-side of the transformer in a PSR flyback converter.

Figure 2A:
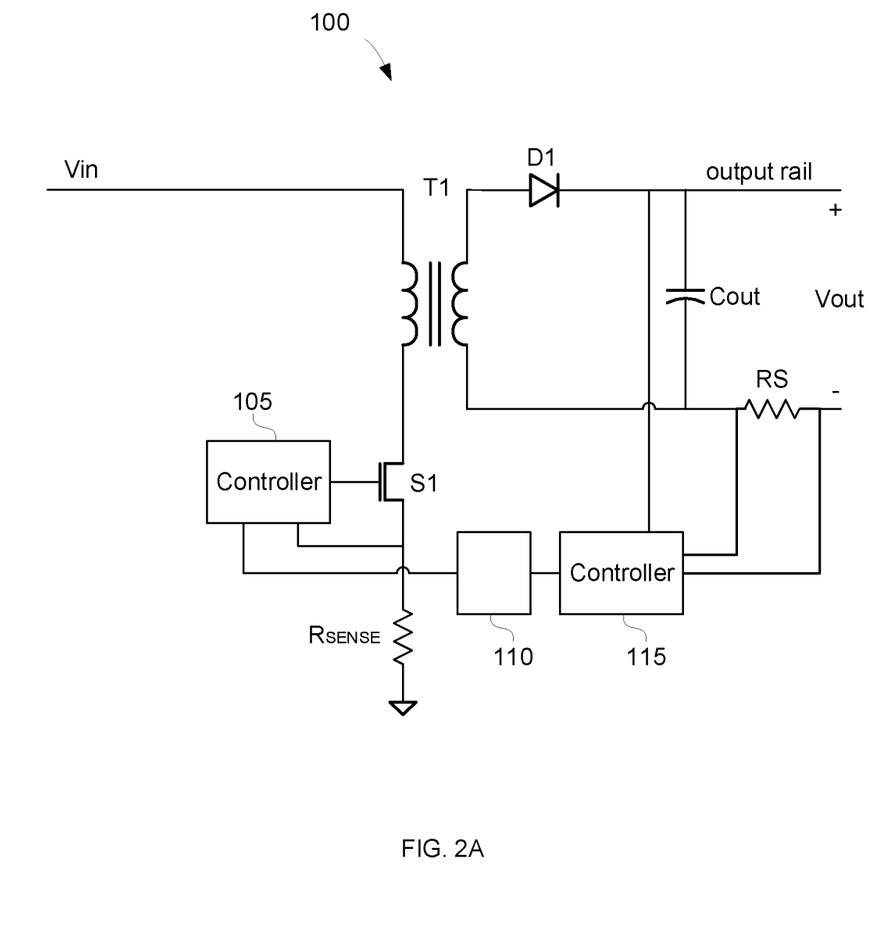
FIG. 2A illustrates a flyback converter in which a secondary-side controller detects the application of a load through an increase in the output current in accordance with an aspect of the disclosure.

An example flyback converter 100 with improved transient load detection and response is shown in FIG. 2A. Flyback converter 100 may have either PSR or SSR. An input voltage Vin such as provided by a full-bridge rectification of an AC voltage from an AC mains drives a primary winding current through a transformer T1 when a primary-side controller 105 drives on a power switch transistor S1. A sense resistor Rsense couples between a drain of power switch transistor S1 and ground. Primary-side controller 105 switches off power switch transistor S1 when a voltage across the sense resistor Rsense equals a desired peak voltage Vipk.

As known in the flyback arts, a secondary-winding current in transformer T1 is rectified so as to not conduct while the primary-winding current conducts. This rectification may be performed by an output diode D1. Alternatively, the secondary winding may be in series with a synchronous rectifier switch transistor that is controlled by a secondary-side controller 115 to administer the rectification of the secondary winding current. Secondary-side controller 115 may directly sense the output voltage on an output rail connected to the secondary winding. Given this direct connection, it was conventional for a secondary-side controller to digitize the output voltage in an ADC as discussed previously for the detection of a load transient (the sudden application of a load) in the output voltage. During a low-load state, the power switch transistor S1 is cycled relatively slowly such that the output voltage is passively supported by an output capacitor Cout that connects between the output rail and the secondary-side ground. This passive support of the output voltage causes the output voltage to rapidly diminish in response to the load application. To increase the load transient detection speed, secondary-side controller 115 detects the load transient through a secondary-side sense resistor RS that is in series with the secondary winding (e.g., the secondary-side sense resistor Rs may be inserted in the secondary-side ground rail). Secondary-side controller 115 monitors a voltage across the secondary-side sense resistor Rs to detect the increase in output current that occurs in response to the sudden application of a load. Advantageously, this increase in output current is phased 90 degrees in advance of the change in the output voltage so that secondary-side controller 115 may quickly respond to the load transient.

The response of secondary-side controller 115 to the detection of the load transient with respect to driving an isolating channel 110 that provides galvanic isolation between the secondary and primary sides of transformer T1 depends upon whether the flyback converter regulates the output voltage using SSR or PSR. An SSR embodiment will be discussed first, followed by a discussion of a PSR embodiment. In addition, the following discussion will assume that the galvanic isolation in isolating channel 110 is provided by an optoisolator. However, it will be appreciated that a digital isolator may be used in alternative embodiments.

Figure 2B:
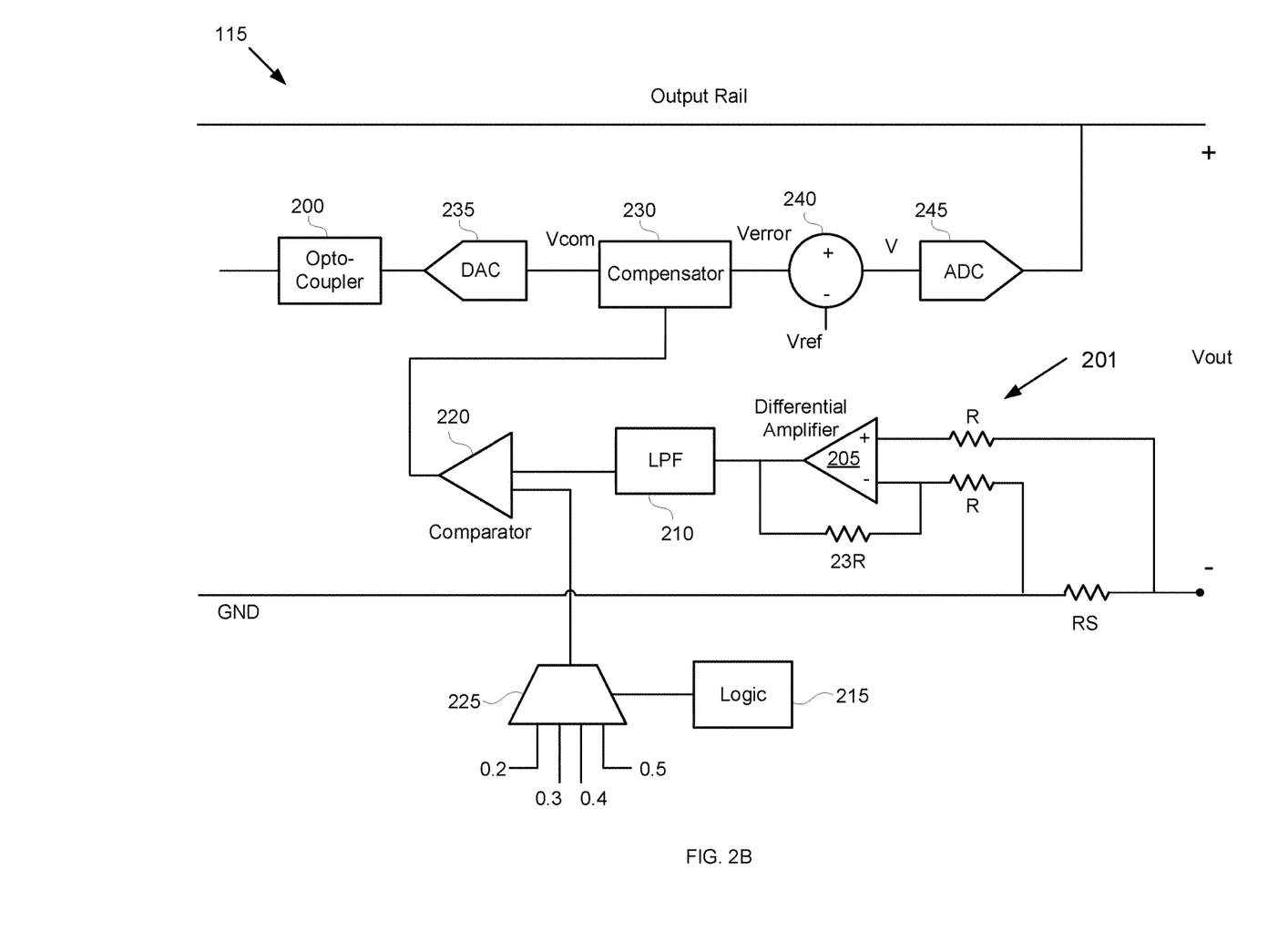
FIG. 2B is a more detailed view of the secondary-side controller of FIG. 2A for an embodiment in which the flyback converter uses secondary-side regulation in accordance with an aspect of the disclosure.

Secondary-side controller 115 for an SSR embodiment is shown in more detail in FIG. 2B. An output current detection circuit 201 includes a differential amplifier 205 that senses the voltage across the secondary-side sense resistor RS through two input resistors of resistance R. A closed-loop gain of differential amplifier 205 depends upon the resistance of a feedback resistor as compared to the input resistance R. In the embodiment of FIG. 2B, the feedback resistance is 23R such that it is 23 times larger than the input resistance R but it will be appreciated that the closed-loop gain of differential amplifier 205 may be varied in alternative embodiments. Differential amplifier 205 amplifies the secondary-side sense resistor voltage to drive a low-pass filter (LPF) 210 in output current detection circuit 201. LPF 210 functions to smooth the output of differential amplifier 205 to reduce the noise sensitivity. A comparator 220 in output current detection circuit 201 compares the filtered output voltage from LPF 210 to a threshold voltage. To provide a tunability for the threshold voltage, it may be selected from a plurality of candidate threshold voltages such as by a multiplexer 225 as controlled by a logic circuit 215. As an example, the candidate threshold voltages may be 0.2 V, 0.3 V, 0.4 V, and 0.5 V. In alternative embodiments, the threshold voltage may instead be fixed. When comparator 220 senses that the filtered and amplified sense resistor voltage is greater than the threshold voltage, a load transient is detected.

To communicate this load transient detection, secondary-side controller 115 may adjust a feedback gain. For example, secondary-side controller 115 may include an ADC that digitizes the output voltage to form a digital value V. A digital adder 240 generates a digital error signal Verror by subtracting a digital reference Vref from the digital value V During normal operation, a compensator circuit 230 compensates the error signal Verror by multiplying the error signal Verror with a gain to produce a control signal Vcom. A digital-to-analog converter (DAC) 235 converts the control signal Vcom into a control voltage. Based upon the control voltage, secondary-side controller 115 drives a secondary-side optocoupler drive current in an optocoupler 200 to transmit the control voltage to the primary-side controller 105. Note that in normal operation, the gain applied by compensation circuit 230 may be relatively small to prevent the output voltage from oscillating from an unstable feedback loop. But in response to the transient detection as indicated by an assertion of an output signal from comparator 220 (or de-assertion depending upon how comparator 220 is configured), compensator 230 applies an increased gain to generate the control signal Vcom. Primary-side controller 105 may thus quickly respond to the resulting increased control voltage as received through optocoupler 200 (or through another type of isolating channel such as a digital isolator in alternative embodiments).

Figure 3:
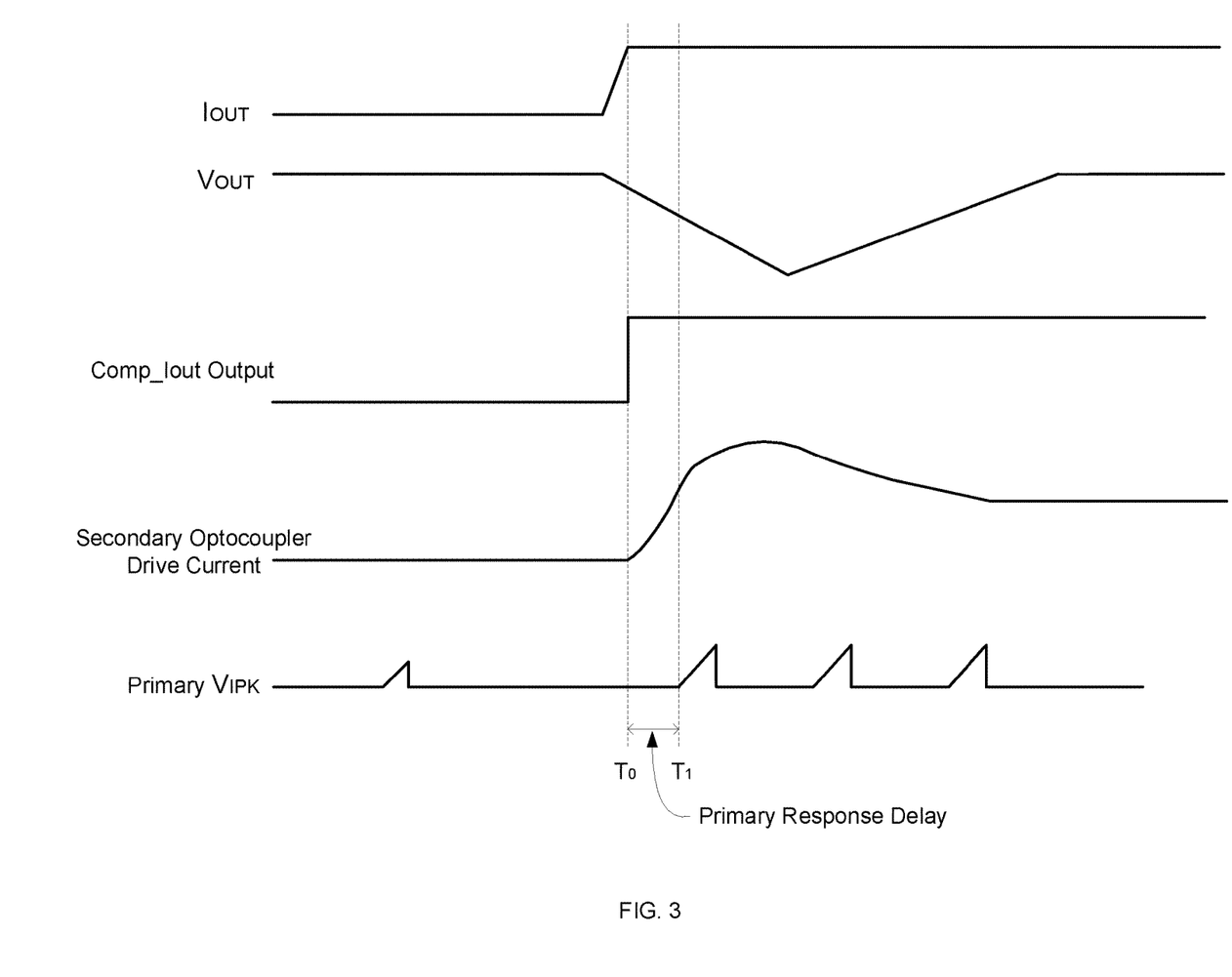
FIG. 3 illustrates some operating waveforms for the flyback converter of FIG. 2B.

Some example waveforms for an SSR embodiment of secondary-side controller 115 are shown in FIG. 3. Prior to a time T0, the flyback converter was a in a low-load state so the power switch cycling as evidenced by the pulsing of the primary-side sense resistor voltage Vipk was relatively slow. The output current Tout was substantially zero whereas the output Vout was in regulation. Just prior to time T0, there was a sudden application of a load, which causes the output of comparator 220 (denoted as Comp Tout Output) to be asserted to the power supply voltage. In response, the secondary-side optocoupler drive current begins ramping up at time T0 with virtually no delay as compared to the conventional Vout-based detection delay discussed with regard to FIG. 1. From time T0 to T1 is the primary response delay, whereupon the output voltage is increased through the cycling of the power switch transistor as triggered by the increase in the secondary-side optocoupler drive current. The output voltage thus does not drop greater than an acceptable voltage margin despite the sudden application of the load.

Figure 4:
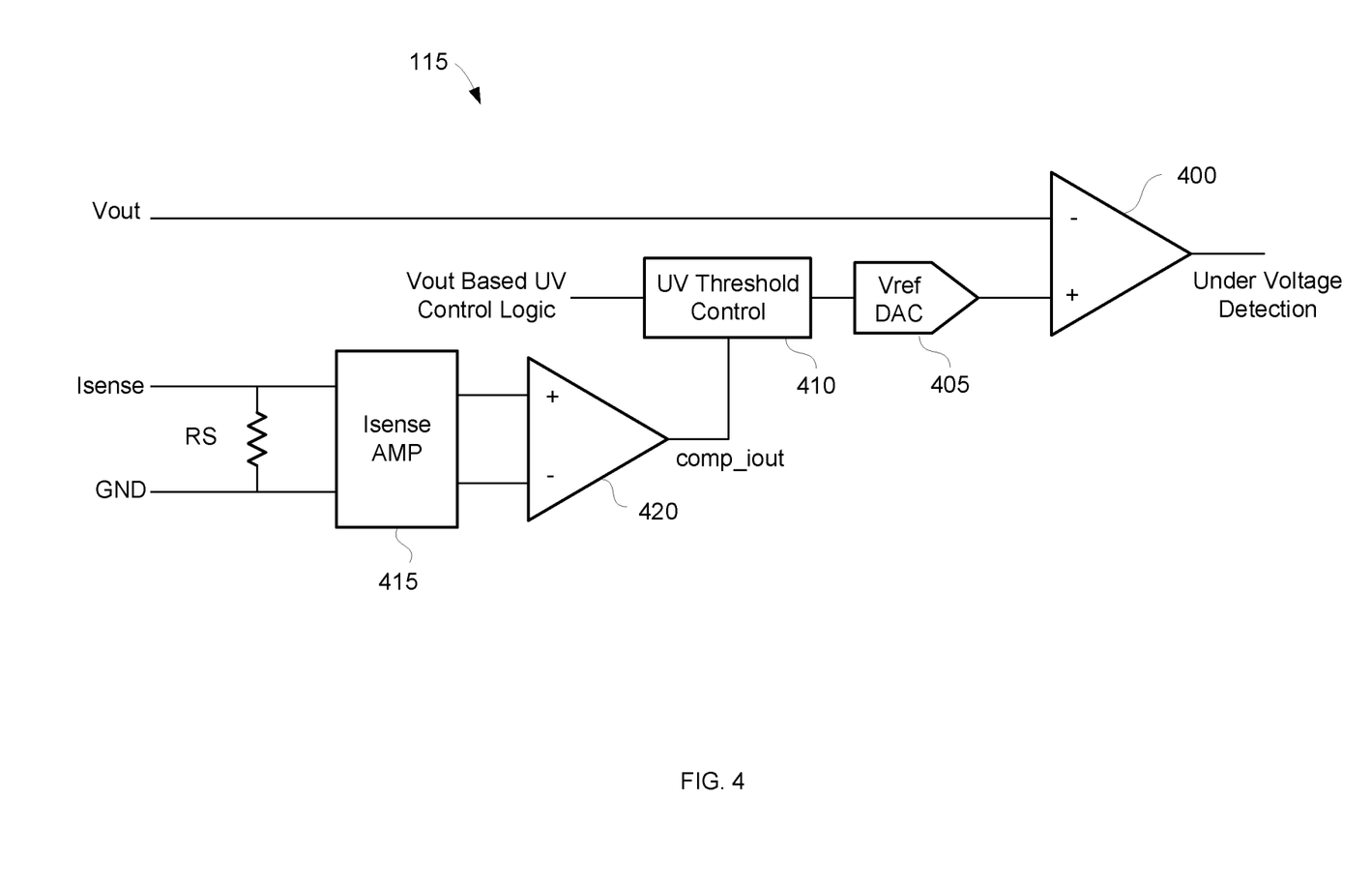
FIG. 4 is a more detailed view of the secondary-side controller of FIG. 2A for an embodiment in which the flyback converter uses primary-side regulation in accordance with an aspect of the disclosure.

Turning now to FIG. 4, a secondary-side controller 115 for PSR is shown. An Isense amplifier 415 and a comparator 420 are shown in simplified form but may be arranged as discussed with regard to differential amplifier 205, LPF 210, and comparator 220 to assert the comparator output signal in response to a load transient detection through the sensing of a threshold increase in the output current. During normal operation (no light load), an under-voltage (UV) comparator 400 functions by comparing the output voltage to a reference voltage Vref such as generated by a Vref DAC 405 that digitizes a digital value from a UV threshold control circuit 410. During normal operation, the reference voltage should be less than the output voltage by some voltage margin. But in response to the assertion of the comparator output signal from comparator 420 (signifying the detection of a load transient), UV threshold control circuit 410 increases the digital value so that the reference voltage Vref from Vref DAC 405 is increased. Comparator 400 can thus more quickly respond to the load transient since the voltage margin between the desired output voltage and the increased reference voltage Vref is reduced. As used herein, a binary signal such as produced by a comparator is deemed to be "asserted" if the binary signal is true, regardless of whether the binary signal is an active-high signal or an active-low signal. Thus, if a comparator output signal is deemed to be asserted herein and it is an active-high signal, the assertion is to a positive voltage such as the power supply voltage. Conversely, if the signal is an active-low signal, the assertion is indicated by the grounding of the signal.

Figure 5:
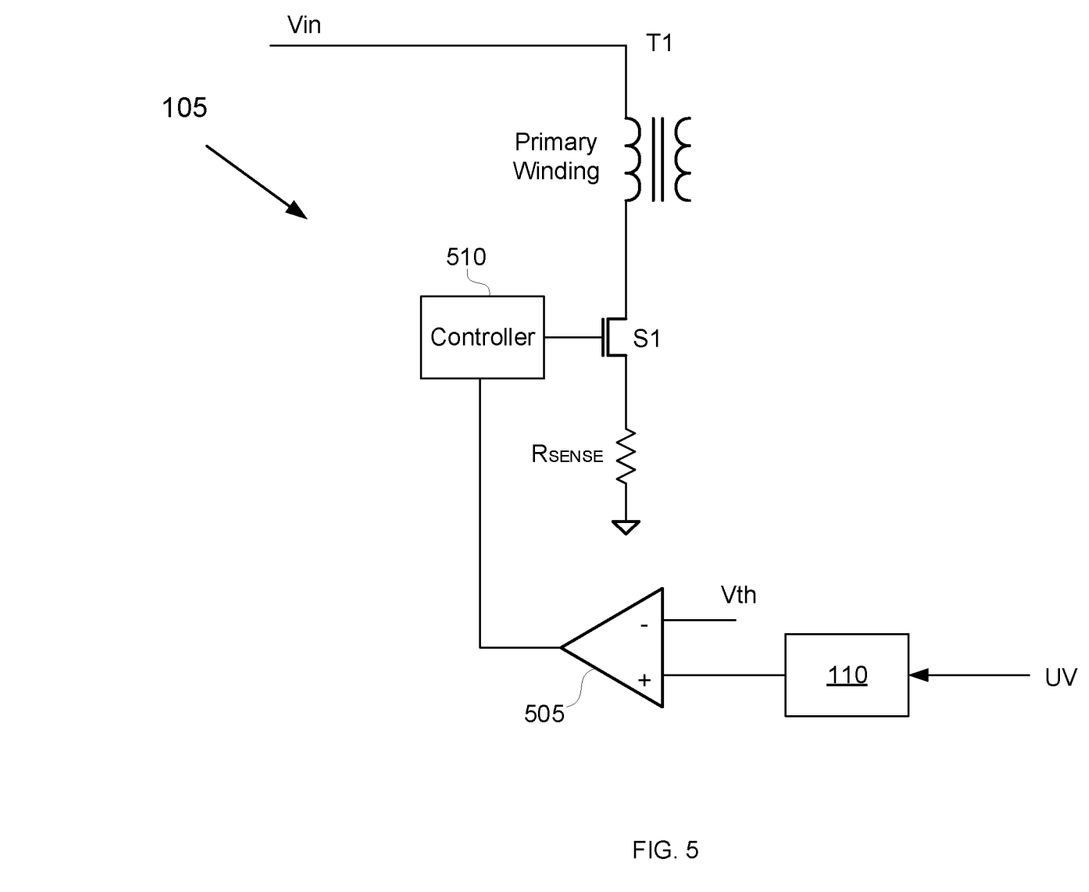
FIG. 5 is a more detailed view of a portion of the primary-side controller in the flyback converter of FIG. 4 in accordance with an aspect of the disclosure.

The resulting UV alarm as denoted through the assertion of the output signal of comparator 400 is transmitted through isolating change 110 (e.g., an optoisolator or digital isolator) to the primary side. To increase the response speed of primary-side controller 105 to the resulting UV alarm as shown in FIG. 5, primary-side controller 105 may include a comparator 505 that asserts an output signal in response to a received signal from isolating channel 110 exceeding a threshold voltage Vth. During normal operation, primary-side controller 105 receives a control signal voltage through isolating channel 110 that is less than the threshold voltage. Primary-side controller 105 would then process the control signal voltage through a feedback loop to control a cycling of the power switch transistor S1 such as through a control of the peak sense resistor voltage Vipk. But such closed-loop processing requires some delay. Thus, primary-side controller 105 includes a switch driver 510 that responds in an open-loop fashion to the assertion of the output signal from comparator 505 to switch on power switch transistor S1 until the sense resistor voltage reaches some pre-defined open-loop value. In response to this open-loop cycling of the power switch transistor S1, the remaining functional blocks used for closed-loop control in primary-side controller 105 may power up. These remaining functional blocks are thus powered down during the low power mode to save power.

Figure 6:
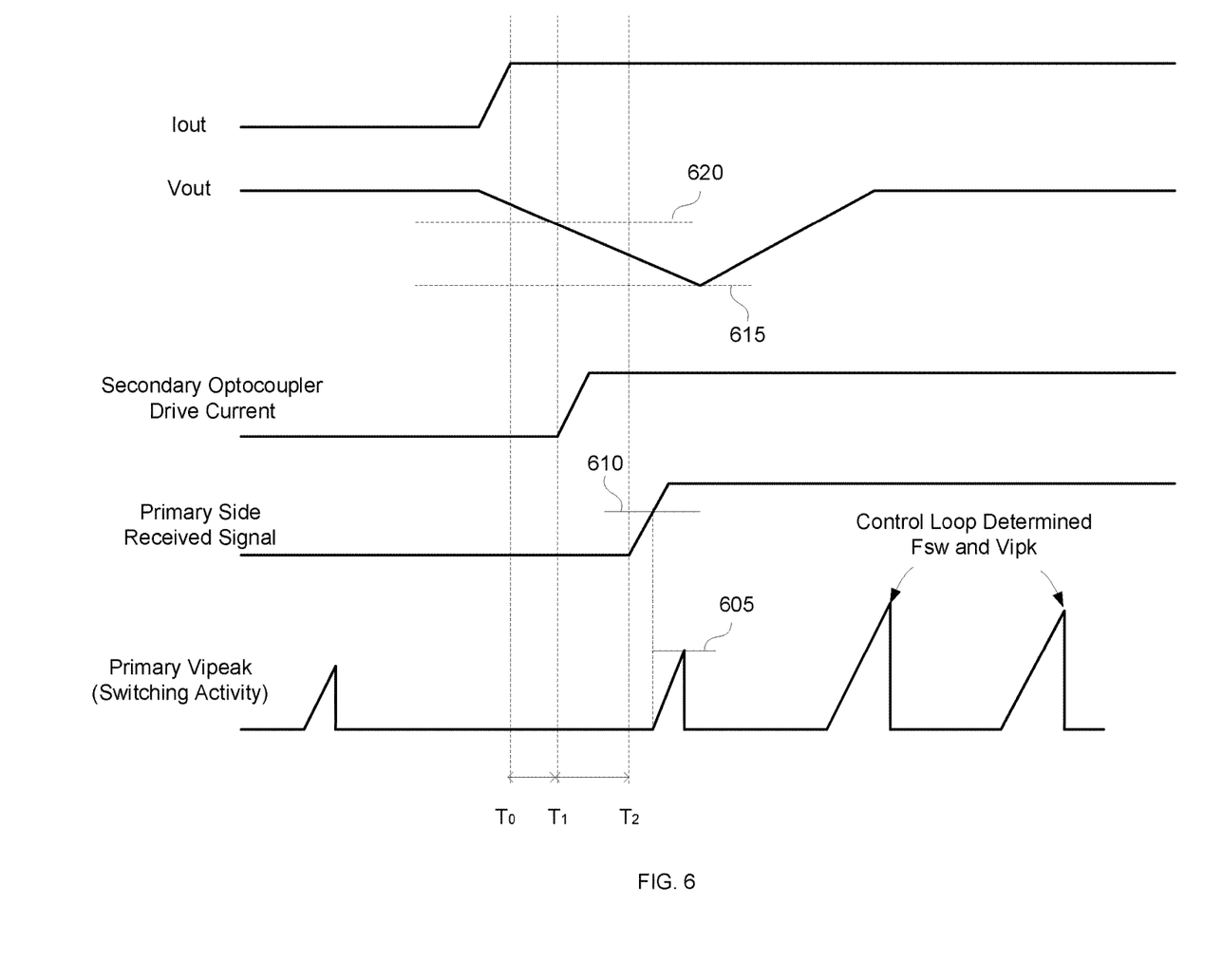
FIG. 6 illustrates some operating waveforms for a first embodiment of the flyback converter of FIG. 5 in accordance with an aspect of the disclosure.

Some example operating waveforms for this open-loop control are shown in FIG. 6. Prior to a time T0, the flyback converter was operating in a low-load state so that the cycling of the power switch (as evidenced through the peak sense resistor voltage Vipk) was relatively infrequent. A load application occurs just before a time T0 such that the output current increases. This increase in output current is detected as discussed with regard to FIG. 4 such that the output signal from comparator 420 goes high to cause the reference voltage Vref to be increased that is compared by UV comparator 400 to the output voltage. This increased reference voltage is indicated by a threshold 620 in FIG. 6. The output voltage crosses threshold 620 at a time T1 such that the secondary-side optocoupler drive current (in an optocoupler embodiment) begins to increase. A primary-side received signal (e.g., a signal voltage) from the optocoupler (or from another form of isolating channel 110) then crosses the threshold voltage for comparator 505 at a time T2. This threshold voltage is represented by a threshold voltage 610 in FIG. 6. The output signal of comparator 505 is then asserted to cause switch driver 510 to pulse the power switch transistor S1 on until the primary-side sense resistor voltage increases to an open-loop value 605. This pulsing of the power switch transistor S1 then enables primary-side controller 105 to measure the output voltage using a primary-side-only feedback technique such that subsequent values of the peak primary-side sense resistor voltage are determined by the feedback loop.

Figure 7:
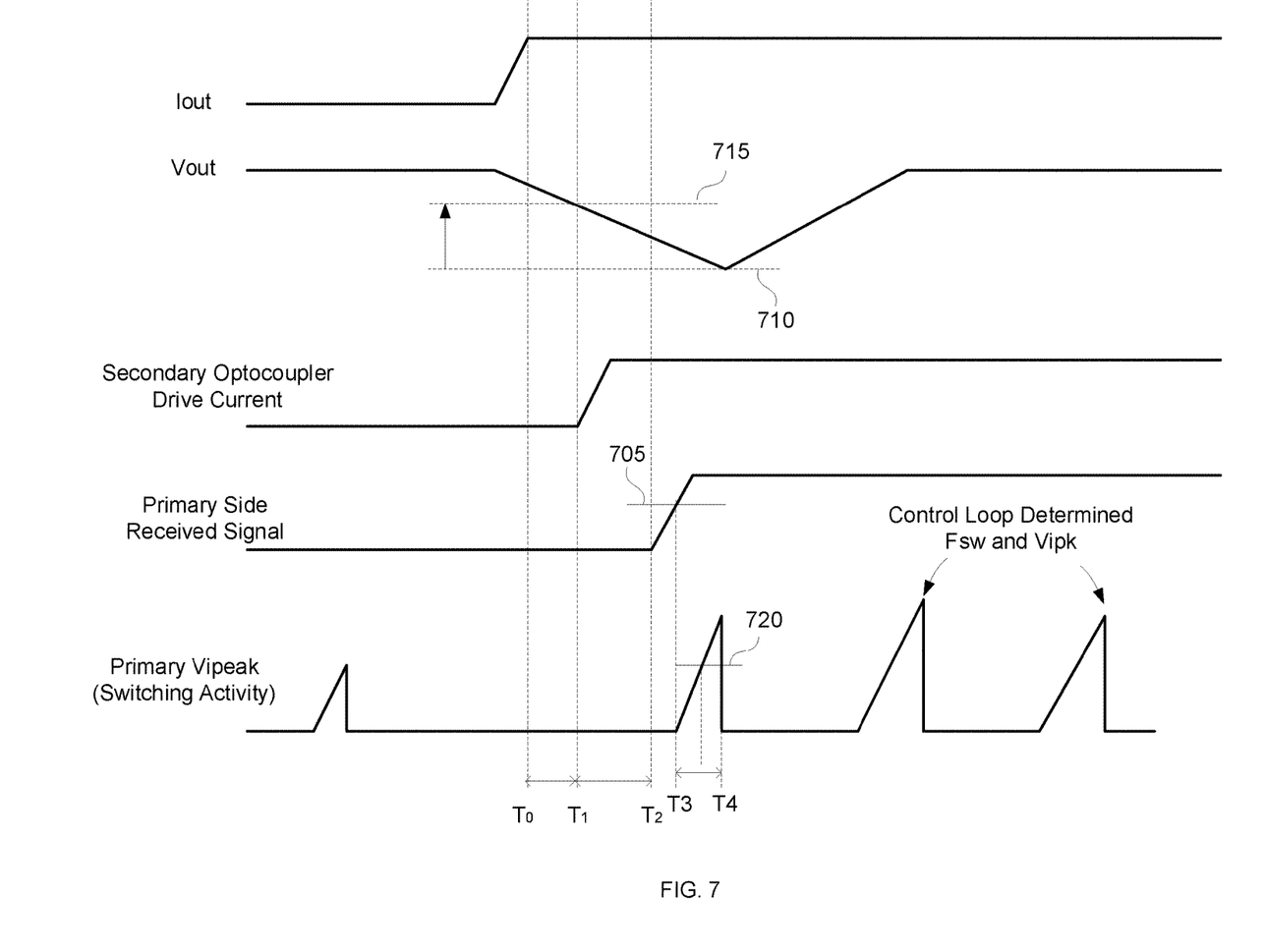
FIG. 7 illustrates some operating waveforms for a second embodiment of the flyback converter of FIG. 5 in accordance with an aspect of the disclosure.

Some waveforms for a variation of this primary-side regulation are shown in FIG. 7. A default under-voltage threshold voltage 710 is used by UV comparator (FIG. 4) during normal operation. Prior to a time T0, the flyback converter was operating in a light load state so that the power switch transistor S1 was cycled relatively infrequently as indicated through the pulsing of the primary-side sense resistor voltage (primary Vipeak). The output current Iout was substantially zero during this low-load state. But just before time T0, a sudden application of a load causes the output current to increase, which causes the output signal of comparator 420 to be asserted. In turn, this assertion of the output signal from comparator 420 causes the under-voltage threshold voltage to increase to an increased value 715. The output voltage Vout drops to equal the increased value 715 at a time T1. The resulting under-voltage alarm is communicated (in an optocoupler embodiment) by then increasing the secondary-side optocoupler drive current. As a result, a primary-side received signal voltage begins to increase starting at a time T2 until it crosses a threshold voltage 705 at a time T3. As a result, comparator 505 asserts its output signal to trigger a power switch transistor on-time beginning at time T3.

The primary-side sense resistor voltage thus begins to rise at time T3. Primary-side controller 105 may include a comparator that compares the primary-side sense resistor voltage to a relatively-low threshold voltage 720. A digital clock in the primary-side controller that may be awakened at time T3 measures an elapsed time from time T3 until threshold voltage 720 is exceeded. This elapsed time may be designated as Tinit. To determine when to switch off the power switch transistor S1 following time T3, primary-side controller 105 may trigger the switch off event after a delay period of Tinit*n elapses from time T3. The variable n may be a fixed value or may be set by the user. Following the end of the initial power switch cycle at a time T4, the subsequent power switch transistor S1 cycles are controlled in a closed-loop fashion as discussed with regard to FIG. 6.

Those of some skill in this art will by now appreciate that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A secondary-side controller for a flyback converter, comprising:
   a secondary-side sense resistor in series with a secondary-side winding of the flyback converter, the secondary-side sense resistor being configured to conduct an output current from the secondary-side winding to produce a secondary-side sense resistor voltage in response to the output current;
   an analog-to-digital control circuit configured to digitize an output voltage into a digital value;
   an adder configured to form a digital error signal responsive to a difference between the digital value and a reference value;
   a compensation circuit configured to multiply the digital error signal by a gain to produce a digital control signal and
   a digital-to-analog converter configured to convert the digital control signal into a voltage signal, wherein the secondary-side controller is configured to drive an isolating channel responsive to the voltage signal; and
   an output current detection circuit configured to command the compensation circuit to increase the gain responsive to a detection of the secondary-side sense resistor voltage being greater than a threshold voltage.

2. The secondary-side controller of claim 1, wherein the output current detection circuit includes:
   a differential amplifier for amplifying the secondary-side sense resistor voltage to provide an amplified voltage;
   a filter for filtering the amplified voltage to provide a filtered voltage; and
   a comparator for comparing the filtered voltage to the threshold voltage.

3. The secondary-side controller of claim 2, wherein the filter is a low-pass filter.

4. The secondary-side controller of claim 2, further comprising;
   a multiplexer for selecting from a plurality of candidate threshold voltages to provide the threshold voltage.

5. The secondary-side controller of claim 4, further comprising a logic circuit for controlling the multiplexer.

6. The secondary-side controller of claim 1, wherein the isolating channel comprises an optocoupler.

7. The secondary-side controller of claim 6, wherein the secondary-side controller is configured to drive the optocoupler with a secondary-side optocoupler drive current.

8. The secondary-side controller of claim 2, wherein the differential amplifier has a first input connected through a first input resistor to a first terminal of the secondary-side sense resistor and has a second input connected through a second input resistor to a second terminal of the secondary-side sense resistor.

9. The secondary-side controller of claim 8, wherein the differential amplifier further includes a feedback resistor connected between an output of the differential amplifier and the second input.

10. A secondary-side controller, comprising:
a secondary-side sense resistor in series with a secondary-side winding of a flyback converter, the secondary-side sense resistor being configured to conduct an output current from the secondary-side winding to produce a secondary-side sense resistor voltage in response to the output current;
an output current detection circuit configured to assert an output signal responsive to a detection of the secondary-side sense resistor voltage being greater than a threshold value;
an under-voltage threshold control circuit configured to increase a threshold voltage from a default value to an increased value responsive to an the assertion of the output signal; and
an under-voltage comparator configured to assert an under-voltage output signal responsive to an output voltage of the flyback converter being greater than the threshold voltage.

11. The secondary-side controller of claim 10, wherein the output current detection circuit includes:
a differential amplifier for amplifying the secondary-side sense resistor voltage to provide an amplified voltage;
a filter for filtering the amplified voltage to provide a filtered voltage; and
a comparator for comprising the filtered voltage to the threshold value.

12. The secondary-side controller of claim 11, wherein the filter is a low-pass filter, the secondary-side controller further comprising:
a multiplexer for selecting from a plurality of candidate threshold voltages to provide the threshold voltage; and
a logic circuit for controlling the multiplexer.

13. The secondary-side controller of claim 11, wherein the secondary-side controller is configured to drive an isolating channel responsive to an assertion of the under-voltage output signal to alert a primary-side controller of an application of a load.

14. The secondary-side controller of claim 13, wherein the isolating channel comprises an optocoupler.

15. The secondary-side controller of claim 13, further comprising a primary-side controller including:
a primary-side comparator configured to compare a received signal from the isolating channel to a threshold to detect the application of the load; and
a switch driver configured to switch on a power switch transistor for an open-loop on-time responsive to an assertion of an output signal from the primary-side comparator.

16. A method of detecting an application of a load for a flyback converter comprising:
sensing a secondary-side sense resistor voltage across a sense resistor in series with a secondary-side winding of the flyback converter, the secondary-side sense resistor being configured to conduct an output current from the secondary-side winding to produce the secondary-side sense resistor voltage;
processing the secondary-side sense resistor voltage to detect the application of the load;
increasing a gain of a secondary-side compensation circuit responsive to a detection of the application of the load to provide an increased gain;
generating an error signal responsive to a difference between an output voltage and a reference voltage;
multiplying the error signal by the increased gain to provide a control signal; and
transmitting the control signal through an isolating channel to a primary-side controller to trigger a cycling of a power switch transistor.

17. The method of claim 16, wherein the processing of the secondary-side sense resistor voltage comprises:
amplifying the secondary-side sense resistor voltage to provide an amplified voltage;
filtering the amplified voltage to provide a filtered voltage; and
comparing the filtered voltage to a threshold voltage to detect the application of the load.

18. The method of claim 17, further comprising:
increasing an under-voltage threshold voltage responsive to the detection of the application of the load to provide an increased under-voltage threshold voltage; and
asserting an under-voltage alarm responsive to the output voltage being less than the under-voltage threshold voltage.

* * * * *